United States Patent [19]

Law et al.

[11] Patent Number: 6,108,762

[45] Date of Patent: Aug. 22, 2000

[54] ADDRESS PROCESSOR AND METHOD THEREFOR

[75] Inventors: Kwok Wah Lawrence Law; Fu Chor Alfred Sin, both of Yuen Long N T, The Hong Kong Special Administrative Region of the People's Republic of China

[73] Assignee: Motorola, Inc., Schaumburg, Ill.

[21] Appl. No.: 08/959,325

[22] Filed: Oct. 28, 1997

[30] Foreign Application Priority Data

Nov. 20, 1996 [SG] Singapore ............................ 9611371-7

[51] Int. Cl.[7] ............................ G11E 29/00; G06F 12/16
[52] U.S. Cl. ............................................. 711/217; 365/200
[58] Field of Search ................................ 365/200, 230.01; 711/217

[56] References Cited

U.S. PATENT DOCUMENTS

| 5,414,758 | 5/1995 | Kuok | 379/88.28 |
| 5,537,631 | 7/1996 | Wong et al. | 714/7 |
| 5,758,056 | 5/1998 | Barr | 714/7 |

*Primary Examiner*—Jack A. Lane

[57] ABSTRACT

An address processor (205) receives contiguous row and column addresses from an address decoder (151). In response, the address processor (205) applies a scattering function to the contiguous row and column addresses to produce scattered row and column addresses of scattered locations in the memory (155).

6 Claims, 2 Drawing Sheets

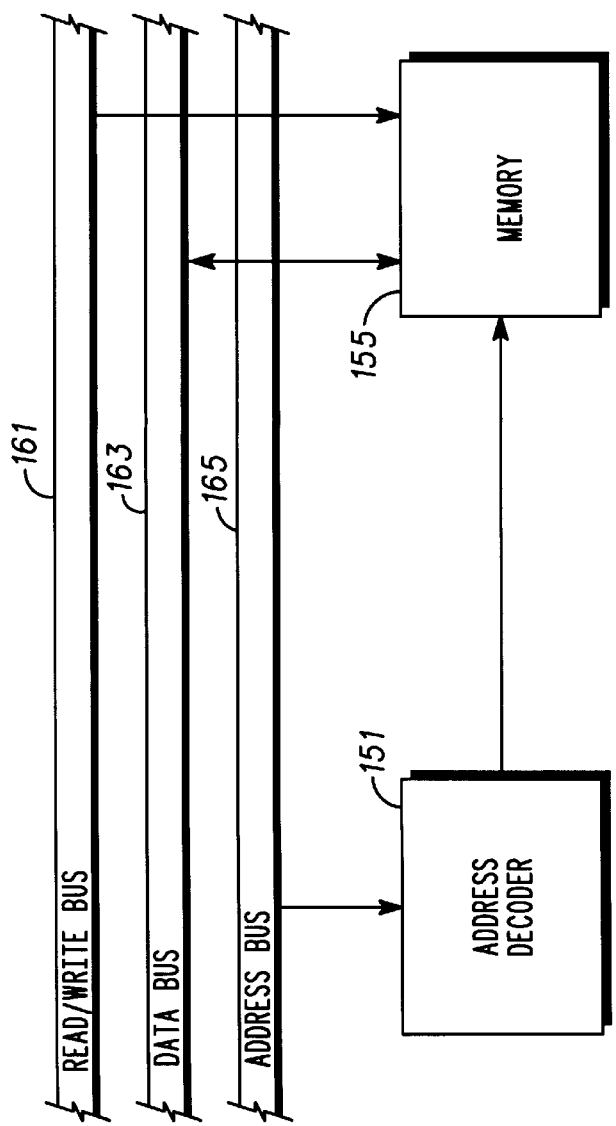

ADDRESS PROCESSOR AND METHOD THEREFOR

FIELD OF THE INVENTION

This invention relates to storing data In an electronic memory, and particularly to storing audio data in a partially defective electronic memory.

BACKGROUND OF THE INVENTION

As is known, dynamic random access memory (DRAM) integrated circuits store information in a matrix of locations. Each location has an address which consists of a row coordinate and a column coordinate.

Partially defective dynamic random access memory (DRAM) integrated circuits are also known as audio grade random access memory (ARAM) integrated circuits. Conventionally, defective locations in an ARAM are unusable because the contents of the location is either a binary "1" or "0", and cannot be changed.

Due to the significantly lower cost of ARAMs compared to DRAMs, ARAMs are widely used in digital telephone answering device applications. In such applications, audio is encoded by an encoding process to produce frames of binary data suitable for storage. Conventionally, when using DRAMS, the frames produced by the encoding process are stored in contiguous storage locations, However, due to defective storage locations in an ARAM, storage in contiguous storage locations of the ARAM would result in unreliable audio storage and reproduction.

A conventional method of storing data reliably in an ARAM is to mask out whole rows and columns which have defective locations. Masking is accomplished by initially storing a binary zero into each storage location of the ARAM, and then storing a binary one into each storage location of the ARAM. Next, a read operation is performed to verify whether the written data matches the data that is read. If an error occurs in one of the storage locations, the addresses of a portion of the ARAM that is known to be good. The addresses of these columns and rows are masked, and consequently will not be used to store data.

A disadvantage of the mask technique is the time consuming process of scanning the ARAM locations and performing the write, read and verify steps for each location of the ARAM.

Another disadvantage of the masking technique is that some of the memory locations of the ARAM must be allocated to store the addresses of the defective locations, which reduces the amount of reliable storage locations in the memory.

BRIEF SUMMARY OF THE INVENTION

The present invention therefore seeks to provide an address processor that overcomes, or at least reduces the above-mentioned problems of the prior art.

Accordingly, in one aspect the invention provides an address processor comprising: an input for receiving an address; an address decoder coupled to the input for receiving the address, and for decoding the address to produce a plurality of contiguous matrix addresses; a matrix address processor coupled to the decoder for receiving the plurality of contiguous matrix addresses, and for applying a scattering function to each of the plurality of contiguous matrix addresses to generate a corresponding plurality of scattered matrix addresses; and an output for coupling to a memory, the output being arranged for providing the plurality of scattered matrix addresses to the memory for addressing a corresponding plurality of scattered storage locations In the memory.

According to a second aspect, the invention provides a method for addressing data in a memory having an addressable matrix of locations, the method comprising the steps of: receiving an address; decoding the address to produce a plurality of contiguous matrix addresses; applying a data scattering function to the plurality of contiguous matrix addresses to generate a corresponding plurality of scattered matrix addresses; and providing the plurality of scattered matrix addresses to the memory to address a corresponding plurality of scattered locations in the memory.

BRIEF DESCRIPTION OF THE DRAWINGS

The invention will now be more fully described, by way of example, with reference to the drawings. of which:

FIG. 1 shows an addressing system in accordance with the prior art;

FIG. 2 shows data stored in the memory in FIG. 1:

DETAILED DESCRIPTION OF THE DRAWINGS

Figures 3, 4:
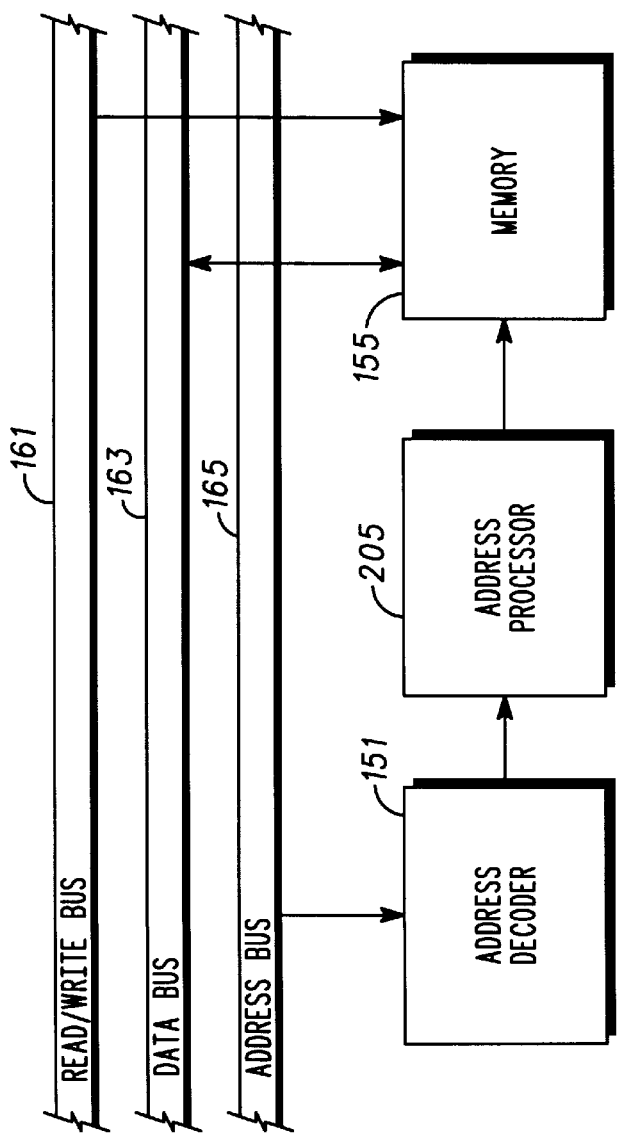
FIG. 3 shows an address processor according to one embodiment of the invention in an addressing system.
FIG. 4 shows data stored in the memory in FIG. 3.

In FIG. 1 the prior art addressing system includes a read/write bus 161 coupled to provide a read or write signal to the memory 155. A data bus 163 is coupled to convey data to and from the memory 155, and an address bus 165 is coupled to provide addresses to an address decoder 151.

In addition to the address decoder 151 and the memory 155, the read/write bus 161, data bus 163, and address bus 165 are coupled to a variety of devices in a conventional electronic system, including a controller (not shown). Typically, the controller is a microprocessor that controls the buses 161, 163 and 165. The microprocessor determines the data which Is on the data bus 163, the address which is on the address bus 165, and the whether a read or write operation is to be performed by asserting either a read signal or a write signal on the read/write bus 161.

The memory 155 is coupled to the address decoder 151 and is a conventional memory having a matrix of storage locations addressable by row and column addresses. Each storage location is addressable by a pair of row and column addresses and stores one bit of binary data represented digitally, or one data bit. When a storage location Is addressed, then depending on whether the read or write signal is asserted on the read/write bus 161, the contents of the storage location will either be presented on the data bus 163, or data on the data bus 163 will be stored in the storage location.

The memory is partially defective, and for illustrative purposes storage locations in row 000 (shown shaded in FIG. 2) represent defective storage locations where data cannot be stored reliably.

The signals on the read/write bus 161 determine whether data on the data bus 163 is to be stored or retrieved from storage locations in the memory 155. When the read signal is asserted on the read/write bus 161, data is retrieved from the storage locations addressed by the address on the address bus 165, and presented on the data bus 163. Alternatively, when the write signal is asserted on the read/write bus 161, data on the data bus 163 is stored in the storage locations addressed by the address on the address bus 165.

The address decoder 151 receives and decodes an address on the address bus 165, and provides an output to the memory 155. When data on the data bus 163 is an eight bit byte, eight bits of digital data are concurrently conveyed on the data bus 163. Consequently, when the address decoder 151 receives an address on the address bus 165, the address decoder 151 decodes the received address in accordance with a predetermined linear decoding scheme to produce eight pairs of contiguous row and column addresses. The eight pairs of row and column addresses address eight contiguous storage locations in the memory 155, in which the eight bits of data on the data bus 163 are stored.

For example in an eight bit address system, the address bus 165 has eight different address lines which convey the eight bit address i.e. A0 to A7. The eight bits A0 to A7 are concurrently provided on the address bus 165 for the address decoder 151. The address decoder 151 decodes the address A0 to A7 on the address bus 165 to produce eight pairs of row and column addresses which address eight contiguous storage locations in the memory 155. Each of the row addresses can be represented by 4 bits i.e. R0 to R3, and each of the column addresses can be represented by 4 bits i.e. C0 to C3.

This type of addressing may be referred to as linear addressing because given the row and column address of the storage location of the first data bit of an eight bit data byte, the row and column addresses of subsequent bits of the eight bit data byte are determined by applying a linear function to the row and column address of the storage location of the first data bit. A commonly encountered linear function simply increments the row or column address of the first storage location by steps of one to address each subsequent storage location until the eight bits of data are completely stored.

The address decoder 151 can be a conventional address decoder similar to that used with a semiconductor memory to address the rows and columns of storage locations in the semiconductor memory. More often, such address decoders are integrated with semiconductor memory circuits on the same semiconductor chip.

In FIG. 2 the address decoder (151 in FIG. 1) decodes an address received on the address bus (163 in FIG. 1) to produce eight pairs of row and column addresses, where each pair of row and column address is made up of a three bit row address and a three bit column address, which are subsequently provided to the memory (155 in FIG. 1).

For example, in response to receiving a first address on the address bus (165 In FIG. 1) and a first data byte on the data bus (163 in FIG. 1), having the data bits 100, 101, 102, 103, 200, 201, 202, and 203. the address decoder (151 in FIG. 1) produces the following eight pairs of contiguous row and column addresses: (000, 000); (000, 001); (000, 010); (000, 011); (000, 100); (000, 101); (000, 110); and (000, 111), which are provided to the memory (155 in FIG. 1). These eight pairs of row and column addresses address eight contiguous storage locations of the memory (155 in FIG. 1) into which the data bits 100, 101, 102, 103, 200, 201, 202, and 203, are stored.

Similarly, in response to receiving a second address and data bits 300, 301, 302, 303, 400, 401. 402, and 403 on the data bus (163 in FIG. 1), the address decoder (151 in FIG. 1) produces the following eight pairs of row and column addresses: (001, 000); (001, 001); (001, 010); (001, 011); (001,100); (001, 101); (001, 110); and (001,111), which address the storage locations of the memory (155 in FIG. 1) into which the data bits 300, 301, 302, 303, 400, 401, 402, and 403, are stored.

With the conventional data storage described above, data bits of an eight bit data byte are stored in the same row, or column, of contiguous storage locations of the memory (155 in FIG. 1). When the current row, or column, of storage locations of the memory (155 in FIG. 1) are used, subsequent data bits are stored in the next row, or column, of the memory (166 in FIG. 1). With the conventional data storage, the data bits 100, 101, 102, 103, 200, 201, 202 and 203 are stored in the same row i.e. the row having row address 000, and having different column addresses i.e. 000, 001, 010, 011, 100, 101, 110 and 111. With this type of linear addressing, the difference between adjacent column addresses is simply an increment of one.

With the conventional data storage, when a row of storage locations of the memory is defective, the entire eight bits of the data byte will be irretrievably lost.

FIG. 3 illustrates the addressing system utilizing an address processor according to one embodiment of the present invention. This addressing system includes the read/write bus 161 coupled to provide a read or write signal to the memory 155, the data bus 163 coupled to convey data to and from the memory 155, and the address addition, the addressing system includes an address processor 205 which is coupled to receive the output of the address decoder 151 and coupled to provide an output to the memory 155.

The address processor 205 receives the contiguous row and column addresses produced by the address decoder 151, as described earlier, and applies a scattering function to each of the contiguous row and column addresses to produce a corresponding number of scattered, or non-contiguous, row and column addresses. The scattered row and column addresses are provided to the memory which addresses non-contiguous storage locations in the memory 155.

The address processor 205 maps the sequential contiguous addresses to a scattered or non-sequential non-contiguous addresses as determined by the scattering function. The scattering function is such that adjacent bits of the eight bit data byte on the data bus 163 is stored in non-contiguous storage locations of the memory 155. The result is a location access sequence in the memory 155 which may be regarded as random.

The scattering function applied by the address processor 205 is characterized by the following equations:

$$R'=\text{Gray}[(R+C)\ \&\ \text{MASK}] \quad (1)$$

$$C'=\text{Gray}[C] \quad (2)$$

$$\text{MASK}=2^N-1 \quad (3)$$

(e.g. MASK=$111_{(binary)}$ for N=3 bit column and row addresses)

Gray=Gray code operation which is defined as:

$$\text{Gray}[i]=(i>>1)\oplus(i) \quad (4)$$

where "&"=logical AND operation

"⊕"=exclusive OR operation

">>"=shift right operation i=an integer in binary format

C=column address in linear mode

R=row address in linear mode

C'=scattered column address

R'=scattered row address.

TABLE 1

| (R, C) | R' = Gray[(R + C)& MASK] | C' = Gray[C] |
|---|---|---|
| (000, 000) | 000 | 000 |
| (000, 001) | 001 | 001 |
| (000, 010) | 011 | 011 |
| (000, 011) | 010 | 010 |
| (000, 100) | 110 | 110 |
| (000, 101) | 111 | 111 |
| (000, 110) | 101 | 101 |
| (000, 111) | 100 | 100 |

The output of the address decoder 151 is defined as (R, C) with the values listed in the first column of Table 1. The address processor 205 applies the scattering function defined by equations (1) and (2) above to the (R, C) values in the first column to produce scattered matrix addresses R' and C' which are listed in the second and third columns of the Table 1, respectively. For example, memory location (000, 100) in the memory 155 will be addressed when the output of the address decoder 151 is (001, 111).

Using the address processor 205, the data 100, 101, 102, 103, 200, 201, 202, and 203 are stored in non-contiguous locations (000,000), (001,001), (011,011), (010,010), (110, 110), (111,111), (101,101) and (100,100), as shown in FIG. 4.

With the addressing method of the described embodiment of the present invention, only data bit 100 of the data byte cannot be stored or retrieved reliably from storage location (00,00). However, the other data bits 101, 102, 103, 200, 201, 202 and 203 of the data byte can be reliably stored and retrieved because the data bits 101, 102, 103, 200, 201, 202 and 203, are stored in storage locations which are scattered away from the defective row 000.

Although data bit 100 may be lost, when the stored data bits 101, 102, 103, 200, 201, 202 and 203, represent encoded audio, and the audio encoding technique that is used can tolerate a one data bit error, any erroneous reproduction of data bit 100 will not be discernible to a human audience.

The describes embodiment of the present invention advantageously enables a defective memory to be Used to reliably store data without the need to scan the entire memory to determine which of the storage locations of the memory are defective. In addition, as there is no need to determine the defective storage locations, consequently there is no need to store the addresses of defective locations, as in the prior art.

Thus, in accordance with this embodiment of the present invention, an address processor receives contiguous row and column addresses, applies a scattering function to the contiguous row and column addresses, and provides corresponding non-contiguous row and column addresses. The non-contiguous row and column addresses store and retrieve the data bits of a data byte in non-contiguous storage locations of a memory, thus enabling a defective memory to be used to provide reliable storage particularly of encoded audio data.

Hence, the described address processor of the present invention does not require the time consuming scanning process nor the use of valuable storage space in the memory as required when using the mask technique. This allows the memory to be operational without the delay associated with the masking technique, and provides a larger usable memory.

What is claimed is:

1. An address processor comprising:

an input for receiving an address;

an address decoder coupled to the input for receiving the address, and for decoding the address to produce a plurality of contiguous matrix addresses;

a matrix address processor coupled to the decoder for receiving the plurality of contiguous matrix addresses, and for applying a scattering function to each of the plurality of contiguous matrix addresses to generate a corresponding plurality of scattered matrix addresses; and an output for coupling to a memory, the output being arranged for providing the plurality of scattered matrix addresses to the memory for addressing a corresponding plurality of scattered storage-locations in the memory.

2. An address processor according to claim 1 wherein each of the plurality of contiguous matrix addresses comprises a row address and a column address, and wherein the each of the plurality of scattered matrix addresses comprises a scattered row address and a scattered column address, and wherein the matrix address processor is adapted to apply the scattering function defined by the following equations:

$$R' = \text{Gray}[(R+C) \& 2^N - 1]$$

$$C' = \text{Gray}[C]$$

wherein Gray=Gray code operation which is defined as:

$$\text{Gray}[i] = (i >> 1) \oplus (i) \text{ and,}$$

where "&"=logical AND operation

"$\oplus$"=exclusive OR operation

">>"=shift right operation i=an integer in binary format

C=column address

R=row address

C'=scattered column address

R'=scattered row address

N=number of digital bits in the row/column address.

3. An address processor according to claim 1 wherein the address processor comprises a digital signal processor.

4. An address processor according to claim 1 wherein the address decoder and the address processor are integrated and comprise a digital signal processor.

5. A method for addressing data in a memory having an addressable matrix of locations, the method comprising the steps of:

receiving an address;

decoding the address to produce a plurality of contiguous matrix addresses;

applying a data scattering function to the plurality of contiguous matrix addresses to generate a corresponding plurality of scattered matrix addresses; and providing the plurality of scattered matrix addresses to the memory to address a corresponding plurality of scattered locations in the memory.

6. A method for addressing data in a memory having an addressable matrix of locations according to claim 5, wherein each of the plurality of contiguous matrix addresses comprises a row address and a column address, and wherein each of the plurality of scattered matrix addresses comprises a scattered row address and a scattered column address, and wherein the scattering function applied is defined by the following logic equation:

$$R'=Gray[(R+C)\&2^N-1]$$

$$C'=Gray[C]$$

wherein Gray=Gray code operation which is defined as:

$$Gray[i](i>>1)\oplus(i), \text{ and}$$

where "&"=logical AND operation
"$\oplus$"=exclusive OR operation
">>"=shift right operation
i=an integer in binary format
C=column address in linear mode
R=row address in linear mode
C'=scattered column address
R'=scattered row address
N=number of digital bits in the row/column address.

* * * * *